(12) United States Patent
Murakami et al.

(10) Patent No.: US 10,290,591 B2
(45) Date of Patent: May 14, 2019

(54) WIRING BOARD, ELECTRONIC DEVICE, AND ELECTRONIC MODULE

(71) Applicant: KYOCERA Corporation, Kyoto-shi, Kyoto (JP)

(72) Inventors: Kensaku Murakami, San Diego, CA (US); Kouichi Kawasaki, Kyoto (JP); Yousuke Moriyama, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/559,092

(22) PCT Filed: Mar. 23, 2016

(86) PCT No.: PCT/JP2016/059157
§ 371 (c)(1),
(2) Date: Sep. 18, 2017

(87) PCT Pub. No.: WO2016/152905
PCT Pub. Date: Sep. 29, 2016

(65) Prior Publication Data
US 2018/0247898 A1    Aug. 30, 2018

(30) Foreign Application Priority Data

Mar. 26, 2015    (JP) ................. 2015-064645

(51) Int. Cl.
*H01L 23/00* (2006.01)
*H01L 23/498* (2006.01)
(Continued)

(52) U.S. Cl.
CPC ...... *H01L 23/562* (2013.01); *H01L 23/49838* (2013.01); *H01L 24/16* (2013.01);
(Continued)

(58) Field of Classification Search
CPC ......... H01L 23/49811; H01L 23/49827; H01L 21/4807; H01L 21/4853; H01L 21/486;
(Continued)

(56) References Cited

U.S. PATENT DOCUMENTS 9,780,275 B2 * 10/2017 Suzuki ................. H01L 33/641
2007/0273014 A1 11/2007 Lee et al.
(Continued)

FOREIGN PATENT DOCUMENTS

JP    2000-138339 A    5/2000
JP    02001358367 A * 12/2001 ............. H01L 33/00
(Continued)

OTHER PUBLICATIONS

International Search Report, PCT/JP2016/059157, dated Jun. 7, 2016, 2 pgs.

*Primary Examiner* — Roy K Potter
(74) *Attorney, Agent, or Firm* — Volpe and Koenig, P.C.

(57) ABSTRACT

A wiring board includes an insulating substrate, mount electrodes arranged to face each other on a first main surface of the insulating substrate along a pair of opposing sides of the insulating substrate in a plan view, and terminal electrodes arranged to face each other on a second main surface of the insulating substrate along another pair of opposing sides of the insulating substrate in a perspective plan view.

15 Claims, 13 Drawing Sheets

(51) Int. Cl.
    *H01L 33/62*     (2010.01)
    *H01L 25/16*     (2006.01)
    *H01L 23/31*     (2006.01)
    *H01L 23/13*     (2006.01)

(52) U.S. Cl.
    CPC .............. *H01L 33/62* (2013.01); *H01L 23/13* (2013.01); *H01L 23/3121* (2013.01); *H01L 23/49822* (2013.01); *H01L 25/167* (2013.01); *H01L 2224/16225* (2013.01); *H01L 2224/16227* (2013.01); *H01L 2924/12035* (2013.01); *H01L 2924/12041* (2013.01); *H01L 2924/181* (2013.01); *H01L 2924/3511* (2013.01)

(58) Field of Classification Search
    CPC ... H01L 23/49838; H01L 33/62; H01L 33/52; H01L 23/3121; H01L 23/13; H01L 24/16; H01L 2924/3511; H01L 2924/19041; H01L 2924/19043; H01L 2924/12035; H01L 33/486; H01L 2224/48091; H01L 2224/48227; H01L 2924/00014
    See application file for complete search history.

(56) References Cited

U.S. PATENT DOCUMENTS

| | | |
|---|---|---|
| 2010/0001390 A1 | 1/2010 | Lee et al. |
| 2012/0098007 A1* | 4/2012 | Kuo ..................... G02F 1/157 257/98 |
| 2018/0151786 A1* | 5/2018 | Beppu ................. H01L 33/50 |

FOREIGN PATENT DOCUMENTS

| | | |
|---|---|---|
| JP | 2007-318076 A | 12/2007 |
| JP | 2008-085296 A | 4/2008 |
| JP | 2009-267041 A | 11/2009 |
| JP | 2011-199228 A | 10/2011 |
| JP | 2013-070224 A | 4/2013 |
| JP | 2013-106008 A | 5/2013 |
| JP | 2013-106054 A | 5/2013 |

* cited by examiner

WIRING BOARD, ELECTRONIC DEVICE, AND ELECTRONIC MODULE

FIELD

The present invention relates to a wiring board, an electronic device, and an electronic module.

BACKGROUND

A wiring board known in the art includes an insulating substrate, a mount electrode arranged on a first main surface of the insulating substrate and having an electronic component mounted on it, a terminal electrode arranged on a second main surface of the insulating substrate, and a wiring conductor connected to the mount electrode and the terminal electrode and arranged inside or on the main surfaces of the insulating substrate. To join an electronic device including an electronic component and a wiring board to, for example, a module substrate using a bond, such as solder, the terminal electrode is joined to the module substrate using the bond, such as solder (refer to Japanese Unexamined Patent Application Publication No. 2009-267041).

BRIEF SUMMARY

Technical Problem

Highly functional and thin electronic devices have been developed recently. A thinner wiring board for an electronic device is more likely to deform or warp during use, when the electronic device receives thermal stress resulting from differences in coefficients of thermal expansion between the insulating substrate and the mount electrode or between the insulating substrate and the terminal electrode. This may cause connection faults between the electronic component and the wiring board or between the wiring board and the module substrate when the electronic device is used for a long time period.

Solution to Problem

One aspect of the present invention provides a wiring board including an insulating substrate, mount electrodes arranged to face each other on a first main surface of the insulating substrate along a pair of opposing sides of the insulating substrate in a plan view, and terminal electrodes arranged to face each other on a second main surface of the insulating substrate along another pair of opposing sides of the insulating substrate in a perspective plan view.

Another aspect of the present invention provides an electronic device including the wiring board with the above structure, and an electronic component mounted on the wiring board.

Another aspect of the present invention provides an electronic module including the electronic device with the above structure, and a module substrate including a connection pad to which the electronic device is connected using a bond.

Advantageous Effects

The wiring board according to one aspect of the present invention includes an insulating substrate, mount electrodes arranged to face each other on a first main surface of the insulating substrate along a pair of opposing sides of the insulating substrate in a plan view, and terminal electrodes arranged to face each other on a second main surface of the insulating substrate along another pair of opposing sides of the insulating substrate in a perspective plan view. In this structure, the mount electrodes and the terminal electrodes extend in different directions. If the wiring board receives high heat from the electronic component during use of the electronic device, the wiring board reduces the concentration of unidirectional thermal stress caused by differences in coefficients of thermal expansion between the insulating substrate and the mount electrodes or between the insulating substrate and the terminal electrodes. This wiring board is less likely to deform or warp. The wiring board with this structure improves connection to the electronic component or to the module substrate, and can have high reliability.

An electronic device according to another aspect of the present invention includes the wiring board according to the above aspect, and an electronic component mounted on the wiring board. This electronic device can have long-term high reliability.

An electronic module according to another aspect of the present invention includes the electronic device according to the above aspect, and a module substrate including a connection pad to which the electronic device is connected using a bond. This electronic module can have long-term reliability.

Figure 10A:
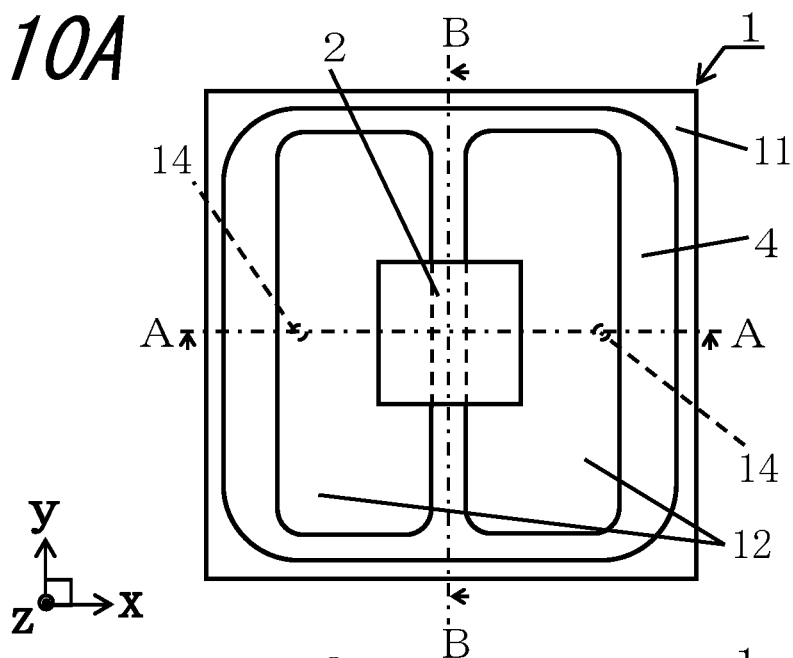
FIG. 10A is a top view of an electronic device according to a third embodiment of the present invention.

12B is a longitudinal-sectional view of the electronic device shown in FIG. 10A taken along line B-B.

Figure 13:
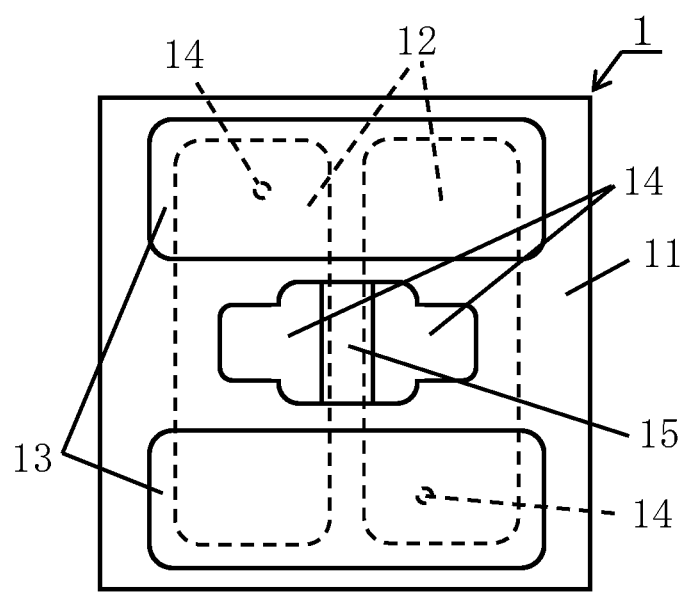
Figure 13:
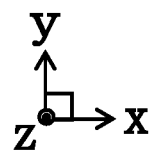

FIG. 13 is a bottom perspective view of another wiring board according to the third embodiment of the present invention.

DETAILED DESCRIPTION

One or more embodiments of the present invention will now be described with reference to the accompanying drawings.

First Embodiment

A light-emitting device according to a first embodiment of the present invention includes a wiring board 1 and an electronic component 2 mounted on a top surface of the wiring board 1 as shown in FIGS. 1A to 2B. As shown in FIGS. 3A and 3B, for example, an electronic device is connected to connection pads 51 on a module substrate 5 included in an electronic module using a bond 6.

The wiring board 1 according to the present embodiment includes an insulating substrate 11, mount electrodes 12 arranged on a first main surface of the insulating substrate 11, terminal electrodes 13 arranged on a second main surface of the insulating substrate 11, and wiring conductors 14 connected to the mount electrodes 12 and the terminal electrodes 13 and arranged inside or on a surface of the insulating substrate 11. The mount electrodes 12 are arranged to face each other along a pair of opposing sides of the insulating substrate 11 in a plan view. The terminal electrodes 13 are arranged to face each other along another pair of opposing sides of the insulating substrate 11 in a perspective plan view. In FIGS. 1A to 3B, the electronic device is mounted in an xy-plane in a virtual xyz space. In FIGS. 1A to 3B, the upward direction refers to a positive direction of a virtual z-axis. The upward or downward directions described herein are for descriptive purposes and do not limit the directions in actual use of the wiring board 1 or other parts.

Figure 1A:
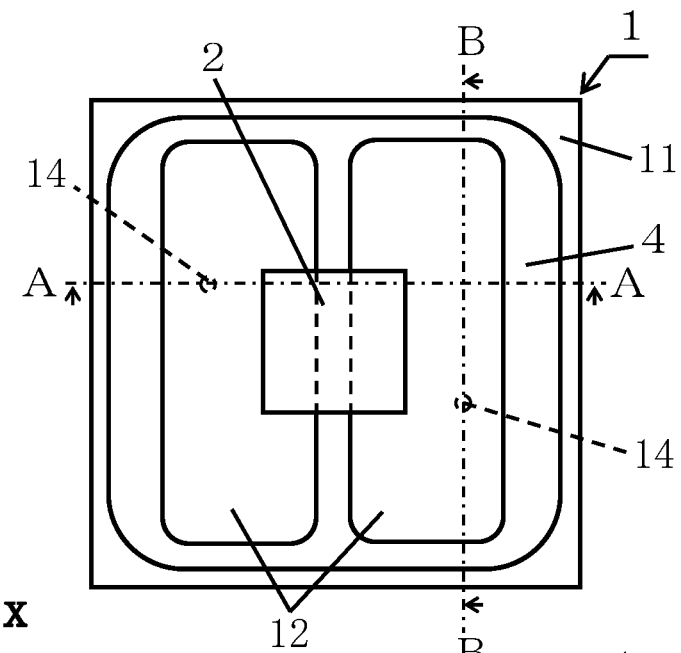
FIG. 1A is a top view of an electronic device according to a first embodiment of the present invention.
Figure 1B:
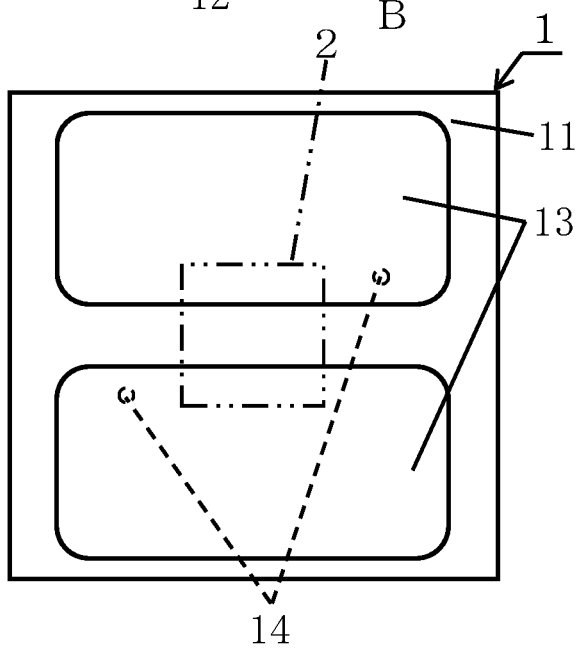
FIG. 1B is a bottom view of the electronic device shown in FIG. 1A.

Portions of the outer edges of the mount electrodes 12 in FIG. 1A on which the electronic component 2 is superposed, and the wiring conductors 14 (through conductors) in FIGS. 1A and 1B are drawn with broken lines. In FIG. 1B, the electronic component 2 is drawn with a two-dot chain line.

Figure 2A:
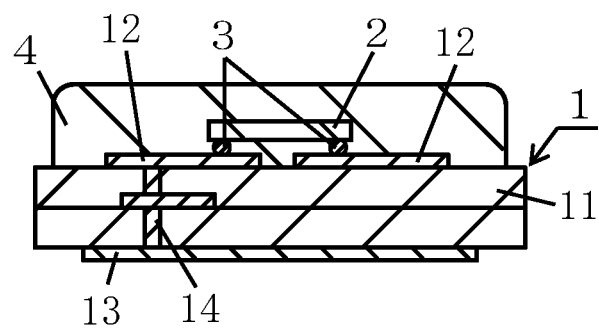
FIG. 2A is a longitudinal-sectional view of the electronic device shown in FIG. 1A taken along line A-A.
Figure 2A:
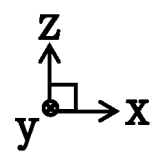
Figure 2B:
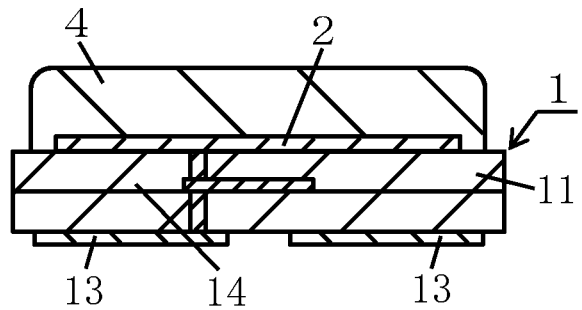
FIG. 2B is a longitudinal-sectional view of the electronic device shown in FIG. 1A taken along line B-B.
Figure 2B:
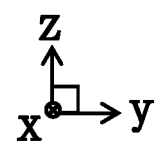
Figure 3A:
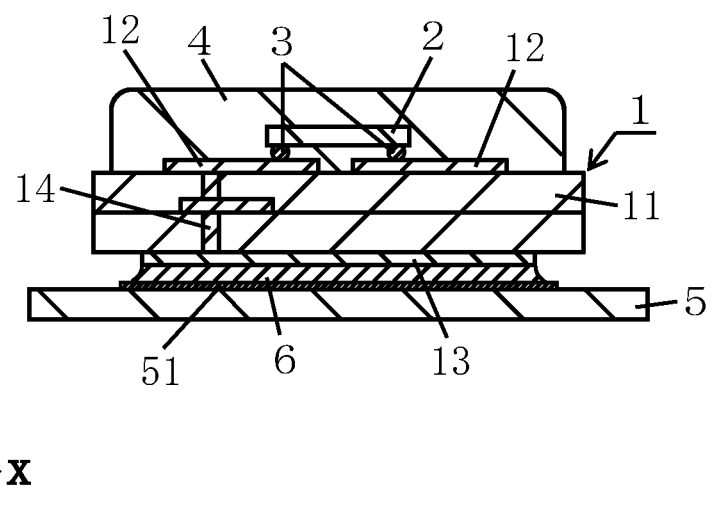
FIGS. 3A and 3B are longitudinal-sectional views of an electronic module including the electronic device shown in FIG. 1 mounted on a module substrate.
Figure 3B:
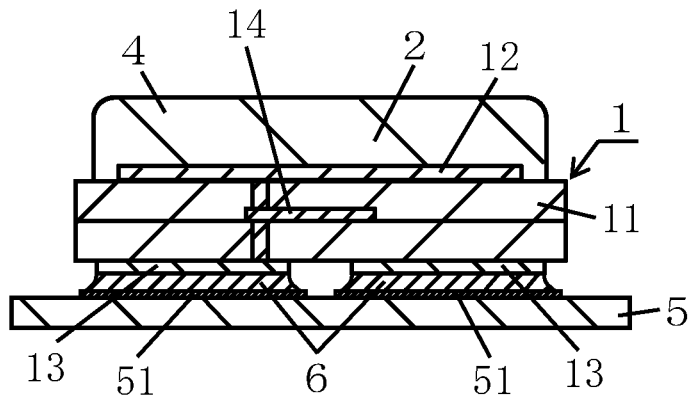
Figure 3B:
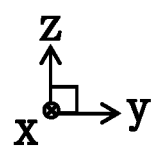

The insulating substrate 11 has the first main surface (top surface in FIGS. 1A, 2A, and 2B) and the second main surface (bottom surface in FIGS. 1B, 2A, and 2B). In a plan view, the insulating substrate 11 is rectangular, and has two pairs of opposing sides (four sides) on each of the first and second main surfaces. The insulating substrate 11 functions as a support for the electronic component 2. The electronic component 2 is bonded and fixed onto the mount electrodes 12 arranged on the first main surface of the insulating substrate 11 using connection members 3, such as solder bumps.

For example, the insulating substrate 11 may be formed from ceramics such as sintered aluminum oxide (alumina ceramic), sintered aluminum nitride, sintered mullite, or sintered glass ceramic. For the insulating substrate 11 formed from, for example, a sintered aluminum oxide, the powders of raw materials such as aluminium oxide ($Al_2O_3$), silicon oxide ($SiO_2$), magnesium oxide (MgO), and calcium oxide (CaO) are mixed with an appropriate organic binder and a solvent to form slurry. The slurry is then shaped into a sheet using a known method such as a doctor blade or by calendering to obtain a ceramic green sheet. The ceramic green sheet then undergoes punching as appropriate. Multiple ceramic green sheets prepared in this manner are laminated on one another as appropriate to form a green laminating body. This green laminating body is then fired at high temperature (about 1600° C.) to complete the insulating substrate 11.

In a plan view, the mount electrodes 12 are arranged to face each other along a pair of opposing sides of the insulating substrate 11 on the first main surface of the insulating substrate 11. In a perspective plan view, the terminal electrodes 13 are arranged to face each other along another pair of opposing sides of the insulating substrate 11 on the second main surface of the insulating substrate 11. In the example shown in FIGS. 1A to 2B, two mount electrodes 12 extend along a pair of opposing sides parallel to Y-direction. Each mount electrode 12 has a dimension greater in Y-direction than in X-direction. Two terminal electrodes 13 extend along another pair of opposing sides parallel to X-direction. Each terminal electrode 13 has a dimension greater in X-direction than in Y-direction. The mount electrodes 12 electrically connect the electronic component 2 mounted on the wiring board 1 to the module substrate 5 or join the wiring board 1 to the electronic component 2. The terminal electrodes 13 electrically connect the electronic component 2 mounted on the wiring board 1 to the module substrate 5 or join the wiring board 1 to the module substrate 5. The wiring conductors 14 are electrically connected to the mount electrodes 12 and the terminal electrodes 13 to electrically connect the electronic component 2 mounted on the wiring board 1 to the module substrate 5. The wiring conductors 14 include wiring layers formed inside or on the surface of the insulating substrate 11 and through conductors extending through the insulator substrate 11 to electrically connect the upper and lower wiring layers.

The mount electrodes 12, the terminal electrodes 13, and the wiring conductors 14 are formed from metalizing powdery metal that is mainly composed of, for example, tungsten (W), molybdenum (Mo), manganese (Mn), silver (Ag), or copper (Cu). The mount electrodes 12, the terminal electrodes 13, and the wiring conductors 14 are formed by, for example, applying a metalizing paste for the mount electrodes 12, the terminal electrodes 13, and the wiring conductors 14 to the ceramic green sheets for the insulating substrate 11 by a printing method such as screen printing, and by firing the ceramic green sheets for the insulating substrate 11 with the applied paste. To form through conductors, for example, through-holes are formed in the ceramic green sheets for the insulating substrate 11 by punching using a die or by laser processing. The through-holes are then filled with a metalizing paste for the through conductors by the printing method. The paste is then fired together with the ceramic green sheets for the insulating substrate 11. The metalizing paste is prepared by mixing the powdery metal described above with an appropriate solvent and a binder and kneading the mixture to have appropriate viscosity. To improve the joining strength with the insulating substrate 11, the paste may contain glass powder or ceramic powder.

Portions of the surfaces of the mount electrodes 12, the terminal electrodes 13, and the wiring conductors 14 uncovered on the insulating substrate 11 are coated with plating layers of a highly corrosion-resistant metal such as nickel or gold. The plating layers reduce corrosion of the mount electrodes 12, the terminal electrodes 13, and the wiring conductors 14 and strengthen connection between the mount electrodes 12 and the electronic component 2, between the mount electrodes 12 and the connection member 3, or between the module substrate 5 and the terminal electrodes 13. For example, a nickel plating layer with a thickness of about 1 to 10 µm and a gold plating layer with a thickness of about 0.1 to 3 µm are sequentially deposited on the portions of the surfaces the mount electrodes 12, the terminal electrodes 13, and the wiring conductors 14 uncovered on the insulating substrate 11.

The plating layer may not be the nickel/gold plating layers, but may be, for example, any other plating layer including nickel/gold/silver plating layers or nickel/palladium/gold plating layers.

An electronic device can be formed by mounting the electronic component 2 on the mount electrodes 12 formed on the first main surface of the wiring board 1. The electronic component 2 mounted on the wiring board 1 is, for example, a semiconductor device such as an integrated circuit (IC) chip or a large-scale integrated circuit (LSI) chip, a light-emitting element, a quartz oscillator, a piezoelectric element such as a piezoelectric vibrator, or one of various sensors. If, for example, the electronic component 2 is a semiconductor device to be connected by flip-chip, the semiconductor device is mounted on the wiring board 1 by connecting its electrodes electrically and mechanically to the mount electrodes 12 using the connection members 3, such as solder bumps, gold bumps, or a conductive resin (for example, anisotropic conductive resin). If, for example, the electronic component 2 is a semiconductor device to be connected by wire bonding, the semiconductor device is fixed onto one mount electrode 12, on which the electronic component 2 is mounted, using a bonding member such as a low-melting point brazing filler metal or a conductive resin, and then mounted on the wiring board 1 by connecting its electrode electrically to the other mount electrode 12 using the connection member 3, such as a bonding wire. The wiring board 1 may have a plurality of electronic components 2 or other types of electronic components such as a resistor, a capacitor, or a Zener diode mounted as appropriate. The electronic component 2 may be sealed with a encapsulant 4, such as resin or glass, or with a lid made of resin, glass, ceramic, or metal as appropriate.

As shown in FIGS. 3A and 3B, the electronic device in the present embodiment is connected to the connection pads 51 of the module substrate 5 with the bond 6 such as solder to complete the electronic module.

The wiring board 1 according to the present embodiment includes the insulating substrate 11, the mount electrodes 12 arranged to face each other on the first main surface of the insulating substrate 11 along the pair of opposing sides of the insulating substrate 11 in a plan view, and the terminal electrodes 13 arranged to face each other on the second main surface of the insulating substrate 11 along the other pair of opposing sides of the insulating substrate 11 in a plan view. The mount electrodes 12 and the terminal electrodes 13 thus extend in different directions. If the wiring board 1 receives high heat from the electronic component 2 during use of the electronic device, the wiring board 1 reduces the concentration of unidirectional thermal stress caused by differences in coefficients of thermal expansion between the insulating substrate 11 and the mount electrodes 12 and between the insulating substrate 11 and the terminal electrodes 13. This wiring board is less likely to deform or warp. The wiring board 1 with this structure improves connection to the electronic component 2 or to the module substrate 5. The resultant wiring board 1 can have high reliability.

The wiring board 1 according to the present embodiment may be used in a thin and high-power electronic device, and can have higher reliability. For example, the wiring board 1 may be used as a wiring board 1 for a thin and high-luminescence light-emitting device, on which a light-emitting element is mounted as the electronic component 2.

As shown in FIGS. 1A to 2B, the mount electrodes 12 and the terminal electrodes 13 extend perpendicular to each other in a perspective plan view. If the wiring board 1 receives high heat from the electronic component 2 during use of the electronic device, the wiring board 1 effectively reduces the unidirectional expansion of the mount electrodes 12 and the terminal electrodes 13. This wiring board is less likely to deform or warp. The wiring board 1 with this structure further improves connection to the electronic component 2 or to the module substrate 5. The resultant wiring board 1 can have high reliability. The mount electrodes 12 and the terminal electrodes 13 extending perpendicular to each other in a top perspective view herein equate to the longitudinal directions of the mount electrodes 12, which are long in one direction (Y-direction in FIGS. 1A and 1B), and the terminal electrodes 13, which are long in another direction (X-direction in FIGS. 1A and 1B), extending perpendicular to each other.

The mount electrodes 12 and the terminal electrodes 13 are perpendicularly superposed on one another. The area of the insulating substrate 11 excluding the mount electrodes 12 or the terminal electrodes 13 in a perspective plan view is small. This structure effectively reduces light leaking outside.

As shown in FIGS. 1A to 2B, the two mount electrodes 12 are superposed on the two terminal electrodes 13 in a perspective plan view. If the wiring board 1 receives high heat from the electronic component 2 during use of the electronic device, the wiring board 1 effectively reduces the concentration of unidirectional thermal stress caused by differences in coefficient of thermal expansion between the insulating substrate 11 and the mount electrodes 12 or between the insulating substrate 11 and the terminal electrodes 13. This wiring board is less likely to deform or warp. In a perspective plan view, the mount electrodes 12 and the terminal electrodes 13 are superposed on one another over a large area. This structure can improve the mechanical strength of the wiring board 1 and reduces cracks or other defects in the insulating substrate 11.

The total area of the opposing mount electrodes 12 in a plan view be equal to or greater than 30%, or may be equal to or greater than 50% of the area of the first main surface of the insulating substrate 11. The total area of the opposing terminal electrodes 13 in a plan view be equal to or greater than 30%, or may be equal to or greater than 50% of the area of the second main surface of the insulating substrate 11 in a plan view.

In the structure having the mount electrodes 12 and the terminal electrodes 13 extending perpendicular to each other, the area over which the mount electrodes 12 and the terminal electrodes 13 in a perspective plan view are superposed on one another may be specifically defined as follows. The area of the mount electrodes 12 superposed on the terminal electrodes 13 in a perspective plan view may be equal to or greater than 20% or equal to or greater than 50% of the total area of the mount electrodes 12. The area of the terminal electrodes 13 superposed on the mount electrodes 12 in a perspective plan view may also be equal to or greater than 20% or equal to or greater than 50% of the total area of the terminal electrodes 13. The mount electrodes 12 and the terminal electrodes 13 extending perpendicular to one another and the mount electrodes 12 and the terminal electrodes 13 superposed on one another over a wide area can enhance the advantage described above. The total area of the opposing mount electrodes 12 may fall within the range of 0.5 to 1.5 times the total area of the opposing terminal electrodes 13 to enhance the above advantage. The thickness of the opposing mount electrodes 12 may fall within the range of 0.8 to 1.2 times the thickness of the opposing terminal electrodes 13 to enhance the above advantage.

Figure 4A:
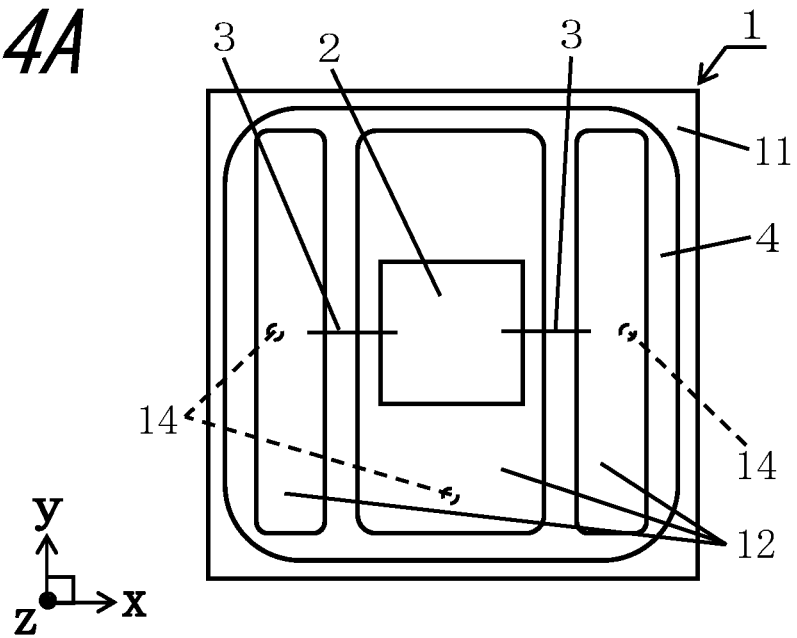
FIG. 4A is a top view of another electronic device according to the first embodiment of the present invention.
Figure 4B:
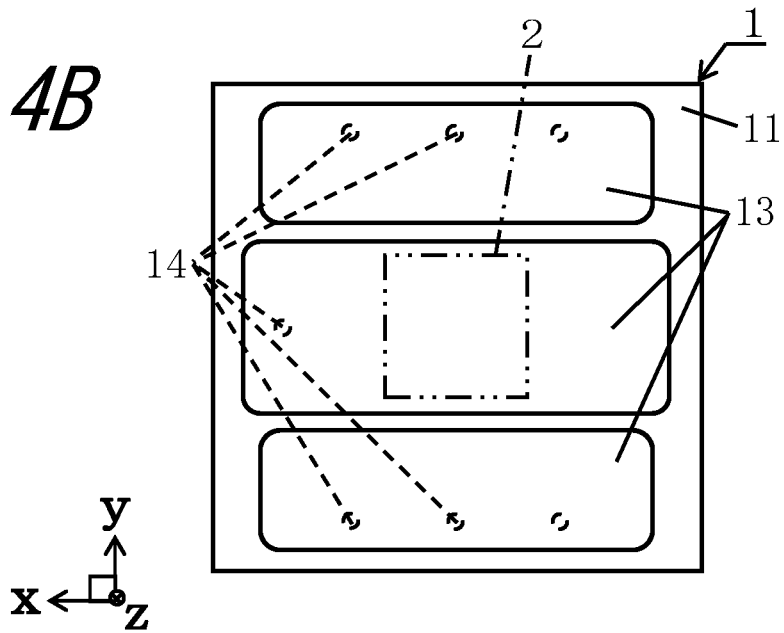
FIG. 4B is a bottom view of the electronic device shown in FIG. 4A.

As shown in FIGS. 4A and 4B, three or more mount electrodes 12 or terminal electrodes 13 may be arranged on each of the main surfaces of the insulating substrate 11. As in the above example, the total area of the opposing mount electrodes 12 may fall within the range of 0.8 to 1.2 times the total area of the opposing terminal electrodes 13.

In the example shown in FIG. 4A, the three mount electrodes 12 are arranged to face one another along a pair of sides of the insulating substrate 11 on the first main surface of the insulating substrate 11. In the example shown in FIG. 4B, the three terminal electrodes 13 are arranged to face one another along the other pair of sides of the insulating substrate 11 on the second main surface of the insulating substrate 11.

Also in the example shown in FIGS. 4A and 4B, the mount electrodes 12 and the terminal electrodes 13 may be arranged perpendicular to each other and each superposed on a plurality of electrodes in a perspective plan view.

Figure 5A:
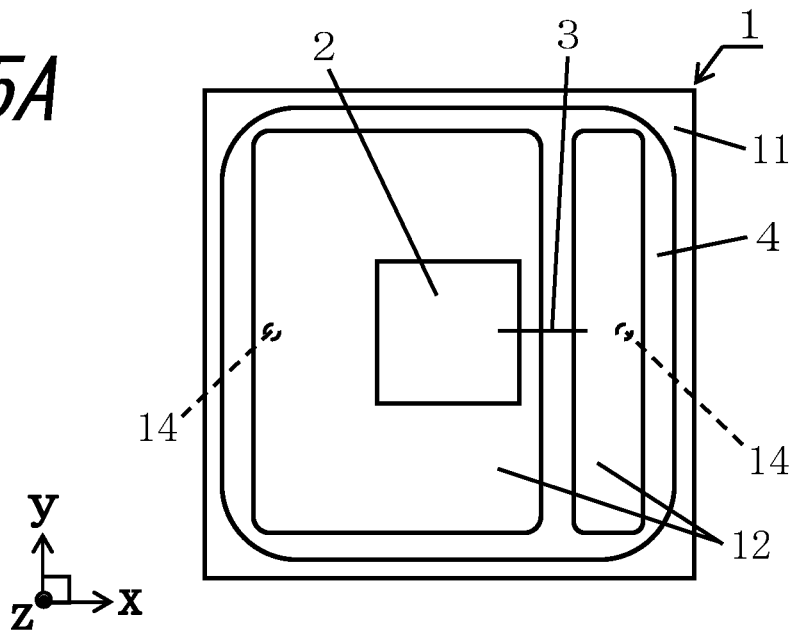
FIG. 5A is a top view of another electronic device according to the first embodiment of the present invention.
Figure 5B:
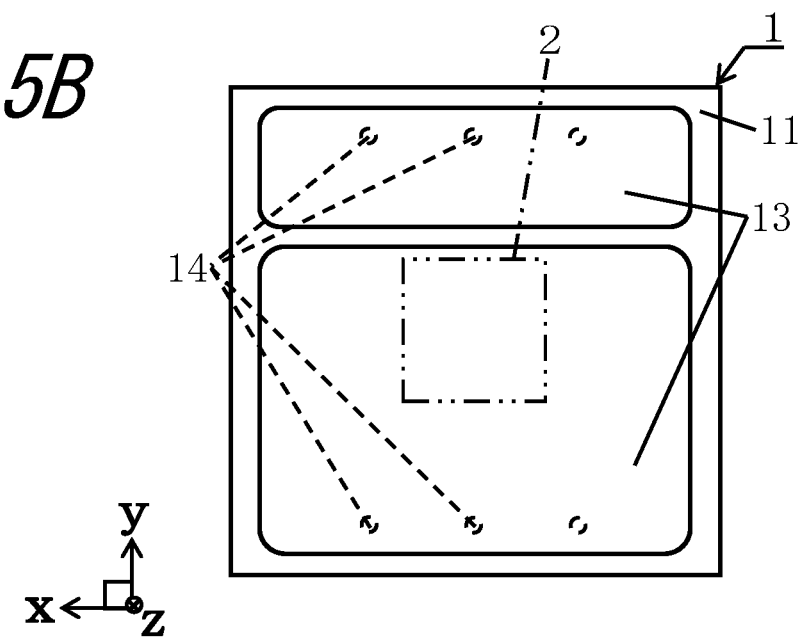
FIG. 5B is a bottom view of the electronic device shown in FIG. 5A.

As shown in FIGS. 5A and 5B, the mount electrodes 12 or the terminal electrodes 13 may have different sizes or shapes each other.

Similarly to the example shown in FIGS. 1A to 2B, the mount electrodes 12 and the terminal electrodes 13 in the examples shown in FIGS. 4A to 5B may be arranged perpendicular to one another or to intersect the multiple electrodes in a perspective plan view.

The electronic device of the present embodiment includes the wiring board 1 having the above structure and thus has higher electrical reliability.

In the electronic module according to another embodiment of the present invention, the electronic device having the above structure is connected to the connection pads 51 of the module substrate 5 using the bond 6. The resultant electronic module can have long-term reliability.

Second Embodiment

An electronic device according to a second embodiment of the present invention will now be described with reference to FIGS. 6A to 8B.

The electronic device according to the second embodiment of the present invention differs from the electronic device according to the above embodiment in that the insulating substrate 11 has, as shown in FIGS. 6A to 8B, a recess 15 in the first main surface of the insulating substrate 11 between the mount electrodes 12 in a plan view.

Figure 6A:
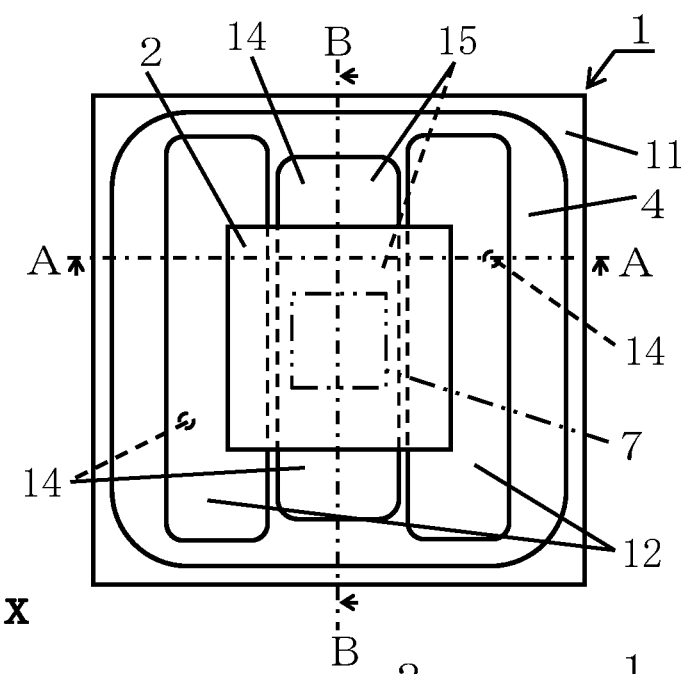
FIG. 6A is a top view of an electronic device according to a second embodiment of the present invention.
Figure 6B:
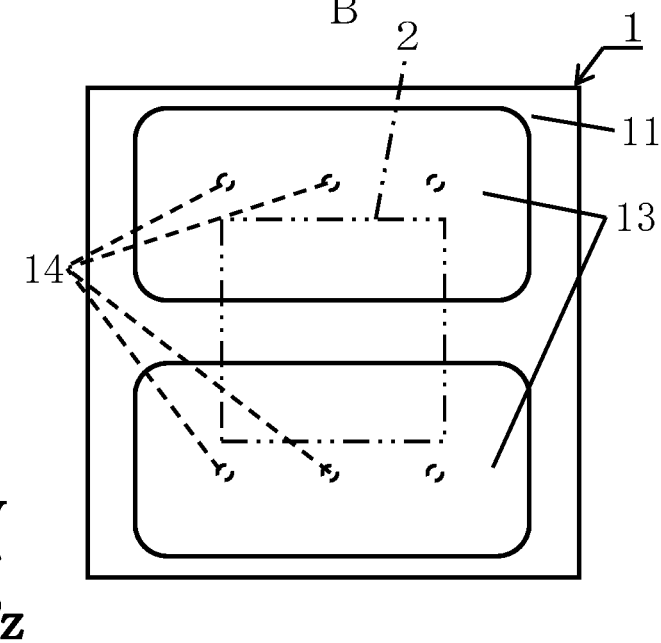
FIG. 6B is a bottom view of the electronic device shown in FIG. 6A.
Figure 7:
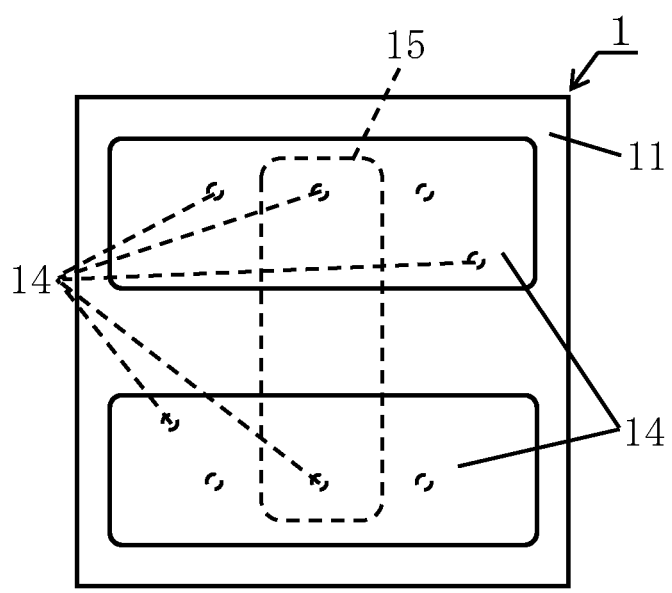
FIG. 7 is a top view showing the inside of the wiring board of the electronic device shown in FIG. 6.
Figure 7:
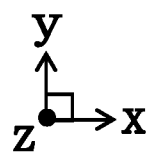
Figure 8A:
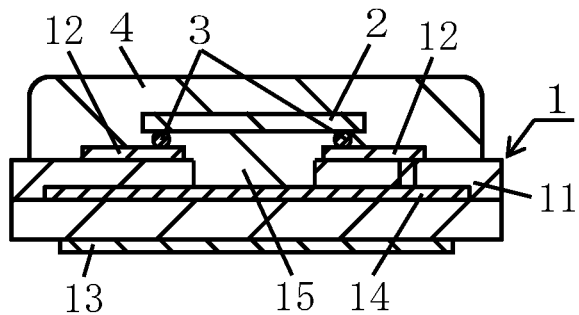
FIG. 8A is a longitudinal-sectional view of the electronic device shown in FIG. 6A taken along line A-A.
Figure 8A:
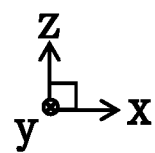
Figure 8B:
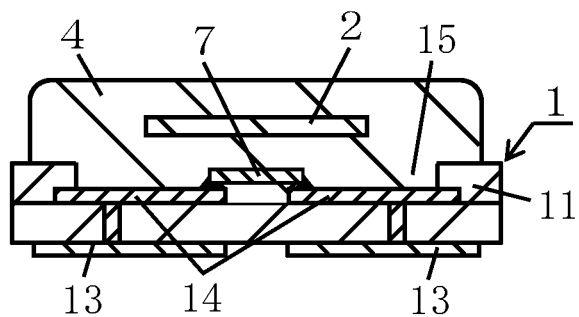
FIG. 8B is a longitudinal-sectional view of the electronic device shown in FIG. 8A taken along line B-B.
Figure 8B:
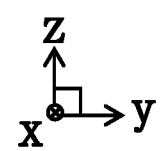

As in the first embodiment, portions of the outer edges of the mount electrodes 12 and the inner walls of the recess 15 in FIG. 6A, on which the electronic component 2 is superposed, and the wiring conductors 14 (through conductors) in FIGS. 6A to 7 are drawn with broken lines. Another electronic component 7 in FIG. 6A and the electronic component 2 in FIG. 6B are drawn with two-dot chain lines.

In the wiring board 1 according to the second embodiment of the present invention, the mount electrodes 12 and the terminal electrodes 13 extend in different directions as in the first embodiment. If the wiring board 1 receives high heat from the electronic component 2 during use of the electronic device, the wiring board 1 reduces the concentration of unidirectional thermal stress caused by differences in coefficient of thermal expansion between the insulating substrate 11 and the mount electrodes 12 and between the insulating substrate 11 and the terminal electrodes 13. This wiring board 1 is less likely to deform or warp. The wiring board 1 with this structure improves connection to the electronic component 2 or to the module substrate 5. The resultant wiring board 1 can have high reliability.

The wiring board 1 according to the second embodiment also has the recess 15. If, for example, a light-emitting element is used as the electronic component 2, another electronic component 7 such as a Zener diode is placed in the recess 15. This structure prevents the two-dimensional area for mounting the another electronic component 7 from increasing, and does not block any light laterally emitted from the light-emitting element, unlike in the example having the another electronic component 7 arranged on the first main surface of the insulating substrate 11. The resultant light-emitting device can have a small size and high luminescence. The recess 15 may be sealed with, for example, resin containing a fluorescent agent or a reflective agent to improve the luminescence of the light-emitting device.

As shown in FIGS. 6A to 8B, the recess 15 can serve as an area for mounting the another electronic component 7. The wiring conductors 14 to which the another electronic component 7 is electrically connectable extend to the bottom surface of the recess 15. The recess 15 with this structure can be formed by laser processing or punching using a die on multiple ceramic green sheets for the insulating substrate 11 to form through-holes defining the recess 15, and by laminating these ceramic green sheets on a ceramic green sheet having no through-hole.

As shown in FIGS. 6A to 8B, the recess 15 extends along the mount electrodes 12. In a perspective plan view, the recess 15, which is a thinner portion of the insulating substrate 11, is superposed on the multiple terminal electrodes 13 arranged on the second main surface of the insulating substrate 11. The recess 15 can thus have higher mechanical strength. The insulating substrate 11 is less likely to have defects such as cracks. As shown in FIGS. 6A to 8B, the wiring conductors 14 arranged inside the insulating substrate 11 and extending to the bottom surface of the recess 15 and the multiple mount electrodes 12 may be superposed with their longitudinal directions extending perpendicular to each other. In the structure having the mount electrodes 12 and the wiring conductors 14 extending perpendicular to each other, the area in which the mount electrodes 12 and the wiring conductors 14 are superposed on one another may be determined in the manner described below to enhance the above advantage. In a perspective plan view, the area of the mount electrodes 12 superposed on the wiring conductors 14 may be equal to or greater than 20% of the total area. Also for the wiring conductors 14 in a perspective plan view, the area of the wiring conductors 14 superposed on the mount electrodes 12 may be equal to or greater than 20% of the total area.

Figure 9:
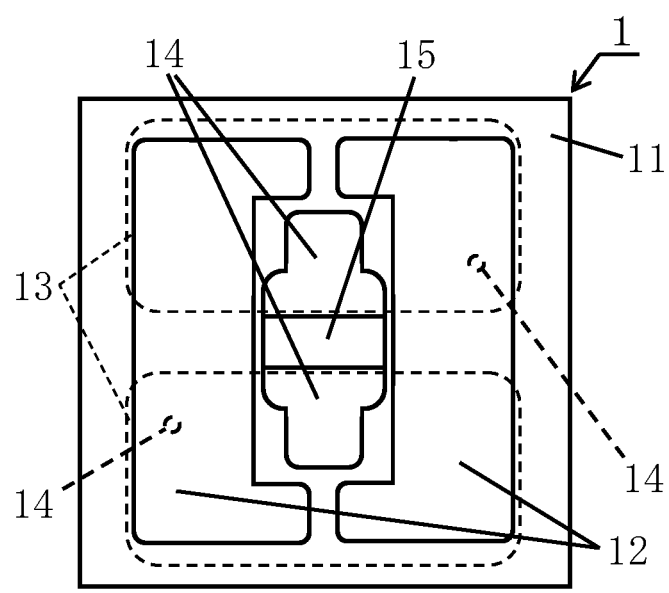
FIG. 9 is a top perspective view of another wiring board according to the second embodiment of the present invention.
Figure 9:
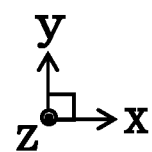

The recess 15 may not be rectangular and may have another shape in a plan view. As shown in FIG. 9, the recess 15 may have both end portions narrower than its middle portion in a plan view. For example, an area in the recess 15 excluding the area in which the another electronic component 7 is to be mounted may be narrower than the area in which the another electronic component 7 is to be mounted. The wiring board 1 having this structure is less likely to deform or warp. In a plan view, the recess 15 may be shorter in the longitudinal direction and longer in the direction in which the mount electrodes 12 face each other, and the area may be superposed on the electronic component 2 and the terminal electrodes 13 on the second main surface. The wiring board 1 having this structure is less likely to deform or warp, and can enhance heat transfer from the electronic component 2 to the wiring board 1.

As shown in FIG. 9 in a plan view, the mount electrodes 12 may have both end portions protruding along a pair of the opposing sides of the insulating substrate 11 to surround the recess 15. The recess 15, which is a thinner portion of the insulating substrate 11, can thus have higher mechanical strength. The insulating substrate 11 is less likely to have defects such as cracks.

The wiring board 1 according to the second embodiment can be manufactured with a method similar to the above method for manufacturing the wiring board 1 according to the first embodiment.

Third Embodiment

An electronic device according to a third embodiment of the present invention will now be described with reference to FIGS. 10A to 12B.

Figure 10B:
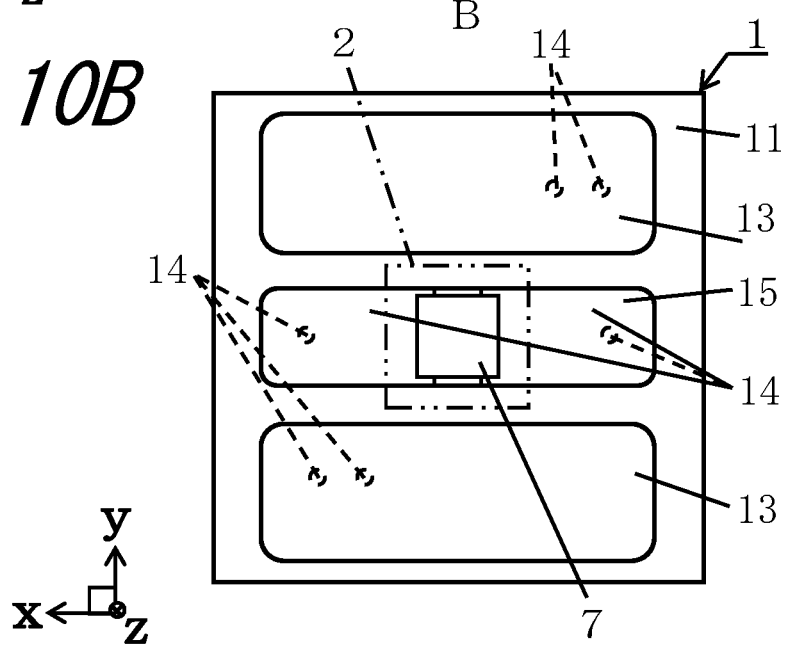
FIG. 10B is a bottom view of the electronic device shown in FIG. 10A.
Figure 11:
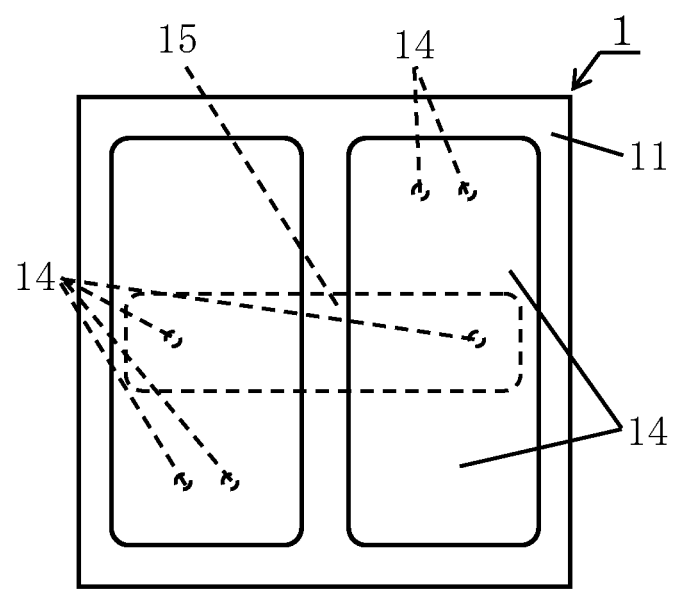
FIG. 11 is a bottom view showing the inside of the wiring board of the electronic device shown in FIGS. 10A and 10B.
Figure 11:
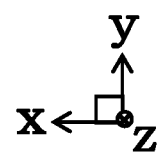
Figure 12A:
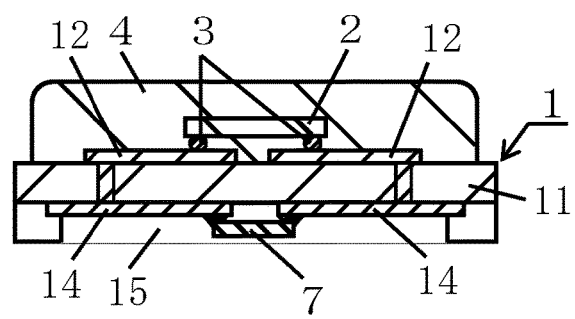
FIG. 12A is a longitudinal-sectional view of the electronic device shown in FIG. 10A taken along line A-A, and FIG.
Figure 12A:
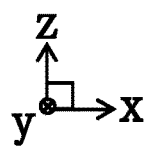
Figure 12B:
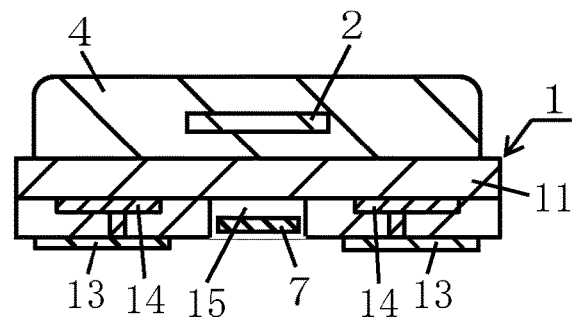
Figure 12B:
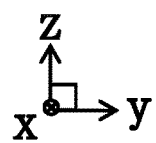

The electronic device according to the third embodiment of the present invention differs from the electronic device according to the above embodiments in that the insulating substrate 11 has, as shown in FIGS. 10A to 12B, a recess 15 in the second main surface of the insulating substrate 11 between the terminal electrodes 13 in a perspective plan view. As in the first embodiment, portions of the outer edges of the mount electrodes 12 in FIG. 10A on which the electronic component 2 is superposed, and the wiring conductors 14 (through conductors) in FIGS. 10A to 11 are drawn with broken lines. In FIG. 10B, the electronic component 2 is drawn with a two-dot chain line.

In the wiring board 1 according to the third embodiment of the present invention, the mount electrodes 12 and the terminal electrodes 13 extend in different directions as in the first embodiment. If the wiring board 1 receives high heat from the electronic component 2 during use of the electronic device, the wiring board 1 reduces the concentration of unidirectional thermal stress caused by differences in coefficients of thermal expansion between the insulating substrate 11 and the mount electrodes 12 and between the insulating substrate 11 and the terminal electrodes 13. This wiring board is less likely to deform or warp. The wiring board 1 with this structure improves connection to the electronic component 2 or to the module substrate 5. The resultant wiring board 1 can have high reliability.

In the wiring board 1 according to the third embodiment of the present invention, as shown in FIGS. 10A to 12B, the recess 15 can serve as an area for mounting the another electronic component 7 as in the second embodiment. The wiring conductors 14 to which the another electronic component 7 is electrically connectable extend to the bottom surface of the recess 15.

As shown in FIGS. 10A to 12B, the recess 15 extends in one direction along and between the terminal electrodes 13. In a perspective plan view, the recess 15, which is a thinner portion of the insulating substrate 11, is superposed on the multiple mount electrodes 12 arranged on the first main surface of the insulating substrate 11. The recess 15 can thus have higher mechanical strength. The insulating substrate 11 is less likely to have defects such as cracks. As shown in FIGS. 10A to 12B, the wiring conductors 14 arranged inside the insulating substrate 11 and extending to the bottom surface of the recess 15 and the multiple terminal electrodes 13 may be superposed with their longitudinal directions extending perpendicular to each other. In the structure having the terminal electrodes 13 and the wiring conductors 14 extending perpendicular to each other, the area in which the terminal electrodes 13 and the wiring conductors 14 are superposed on one another may be determined in the manner described below to enhance the above advantage. In a perspective plan view, the area of the terminal electrodes 13 superposed on the wiring conductors 14 may be equal to or greater than 20% of the total area. Also for the wiring conductors 14 in a perspective plan view, the area of the wiring conductors 14 superposed on the terminal electrodes 13 may be equal to or greater than 20% of the total area. As in the second embodiment, the recess 15 may have both end portions narrower than its middle portion in a plan view to reduce deformation or warpage of the wiring board 1.

The wiring board 1 according to the third embodiment can be manufactured with a method similar to the above method for manufacturing the wiring board 1 according to the first or second embodiment.

The present invention is not limited to the examples described in the above embodiments and may be modified variously. For example, the insulating substrate 11 of the wiring board 1 may have its corners chamfered or cut in an arc shape in the thickness direction of the insulating substrate 11.

The terminal electrodes 13 are arranged on the second main surface of the insulating substrate 11. The insulating substrate 11 may have a hole formed through the side surface and the second main surface and having its inner surface covered by a terminal electrode 13, which forms a castellation conductor. The mount electrode 12 may also cover the inner surface of a hole formed in the side surface of the insulating substrate 11.

The components of the wiring boards 1 according to the first to third embodiments may be combined. For example, the wiring board 1 according to the second embodiment may include three or more terminal electrodes 13 on the second main surface of the insulating substrate 11, or the wiring board 1 according to the third embodiment may include three or more mount electrodes 12 on the first main surface of the insulating substrate 11.

In each of the wiring boards 1 according to the first to third embodiments, the mount electrodes 12 and the terminal electrodes 13 are rectangular in a plan view. In some embodiments, the mount electrodes 12 or the terminal electrodes 13 may each have, for example, a protrusion partially on their edges in a plan view to indicate, for example, the orientation of the wiring board 1 or the electronic device. In other embodiments, the mount electrodes 12 or the terminal electrodes 13 may have partially removed edges.

In the above embodiments, the mount electrodes 12 and the terminal electrodes 13 are formed by co-firing. In some embodiments, the metal layer may be formed by, for example, post-firing or thin film deposition.

The invention claimed is:
1. A wiring board, comprising:
an insulating substrate;
mount electrodes arranged to face each other on a first main surface of the insulating substrate along a pair of opposing sides of the insulating substrate in a plan view; and
terminal electrodes arranged to face each other on a second main surface of the insulating substrate along another pair of opposing sides of the insulating substrate in a perspective plan view, wherein the insulating substrate has a recess in the first main surface between the mount electrodes in a plan view.

2. The wiring board according to claim 1, wherein the mount electrodes and the terminal electrodes extend perpendicular to each other in a perspective plan view.

3. The wiring board according to claim 2, wherein the mount electrodes and the terminal electrodes are superposed on one another in a perspective plan view.

4. The wiring board according to claim 1, wherein
the recess extends along the mount electrodes and is superposed on the terminal electrodes in a perspective plan view.

5. The wiring board according to claim 1, wherein
the mount electrodes each have two end portions protruding along a pair of opposing sides of the insulating substrate to surround the recess in a plan view.

6. A wiring board, comprising:
an insulating substrate;
mount electrodes arranged to face each other on a first main surface of the insulating substrate along a pair of opposing sides of the insulating substrate in a plan view; and
terminal electrodes arranged to face each other on a second main surface of the insulating substrate along another pair of opposing sides of the insulating substrate in a perspective plan view,
wherein the insulating substrate has a recess in the second main surface between the terminal electrodes in a perspective plan view.

7. The wiring board according to claim 6, wherein
the recess extends along the terminal electrodes and is superposed on the mount electrodes in a perspective plan view.

8. The wiring board according to claim 4, wherein
the recess has two end portions narrower than a middle portion in a plan view.

9. An electronic device, comprising:
the wiring board according to claim 1; and
an electronic component mounted on the wiring board.

10. An electronic module, comprising:
the electronic device according to claim 9; and
a module substrate including a connection pad to which the electronic device is connected using a bond.

11. The wiring board according to claim 4, wherein
the mount electrodes each have two end portions protruding along a pair of opposing sides of the insulating substrate to surround the recess in a plan view.

12. The wiring board according to claim 2, wherein
the insulating substrate has a recess in the second main surface between the terminal electrodes in a perspective plan view.

13. The wiring board according to claim 3, wherein
the insulating substrate has a recess in the second main surface between the terminal electrodes in a perspective plan view.

14. The wiring board according to claim 5, wherein
the recess has two end portions narrower than a middle portion in a plan view.

15. The wiring board according to claim 7, wherein
the recess has two end portions narrower than a middle portion in a plan view.

\* \* \* \* \*